(12) United States Patent
Nygaard, Jr.

(10) Patent No.: US 7,412,355 B2
(45) Date of Patent: Aug. 12, 2008

(54) ANALOG DISPLAY OF SIGNAL SWING AND LOGIC ANALYZER THRESHOLDS

(75) Inventor: Richard A Nygaard, Jr., Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/253,083

(22) Filed: Oct. 17, 2005

(65) Prior Publication Data

US 2007/0088529 A1  Apr. 19, 2007

(51) Int. Cl.
*G06F 15/00* (2006.01)
*G06F 3/14* (2006.01)

(52) U.S. Cl. .................. 702/189; 702/68; 715/771; 725/22

(58) Field of Classification Search ............. 702/66–68, 702/71–72, 189; 715/771, 734, 856; 345/12, 345/44, 156, 440; 725/22
See application file for complete search history.

(56) References Cited

U.S. PATENT DOCUMENTS 4,040,025 A * 8/1977 Morrill et al. .................. 702/68
6,707,474 B1 * 3/2004 Beck et al. .................. 715/771
2003/0115591 A1 * 6/2003 Weissmueller et al. ........ 725/22

* cited by examiner

Primary Examiner—John E. Barlow, Jr.
Assistant Examiner—John H Le

(57) ABSTRACT

A Logic Analyzer has an intuitive and informative analog presentation of signal activity and threshold settings formed by gathering a collection of factors pertaining to the measurement to be performed, such as information about which channels are members of labeled collections. A scan of signal activity is performed for each assigned channel as its threshold is briefly swept. This produces a range of voltage that describes that signal's signal activity. For each Probe Pod these ranges are then displayed in columns as adjacent vertical segments of a voltage swing Y axis along a channels-within-a-probe-pod X axis. The Y axis is labeled with actual voltage values. Superimposed upon this analog style display is a horizontal line indicating the associated threshold for that Probe Pod. Further annotations include channel identifiers and signal activity indicators whose shapes connote recurring transitions and signals that appear to be 'stuck' either HIGH or LOW. Collections of related columns are labeled according to the Probe Pod with which they are associated.

9 Claims, 9 Drawing Sheets

ANALOG DISPLAY OF SIGNAL SWING AND LOGIC ANALYZER THRESHOLDS

BACKGROUND OF THE INVENTION

Logic Analyzers are tools that capture the (binary) logic values of TRUE and FALSE for signals that occur during the operation of digital equipment. As inputs to the Logic Analyzer, these signals are individually referred to as channels and are often grouped into related named collections, such as signals defining a bus within the digital equipment under test. The related signals might have a collective meaning, such as a value for data, an address, or simply represent some other internal condition that is quite particular to the operation of the digital equipment, or of some other apparatus. The 'meaning' is generally called a 'state' (as in 'state of affairs'—or 'condition') and its value may be indicated through the use of some convenient integer notation, such as binary or hexadecimal. In any event, Logic Analyzers (sometimes called Logic State Analyzers, or just State Analyzers) usually capture entire sequences of such states and store their descriptions in a memory. The stored information is called a 'trace' and can be inspected to help verify proper system operation or diagnose problems.

The vast majority of signals measured by Logic Analyzers are clocked signals, meaning that changes in states are synchronous with transitions in an associated clock signal. The transitions in the clock signal indicate when the logic values of the data signals are to be measured, or captured. This leads us to observe that Logic Analyzers make extensive use of threshold detection: (i) a transition through a threshold for a clock signal indicates a time when (ii) existing (earlier) threshold comparisons for data signals are to be captured as a state.

Threshold detection is performed by placing a voltage comparator circuit in the path of every signal of interest. That is, every channel, whether for a data signal or a clock, is equipped with a comparator. A comparator is a two-input circuit. One input is the signal of interest (the input to the channel) and the other is a selectable comparison voltage commonly called a threshold. The function of the comparator is to indicate at an output whether the signal input for the channel is above or below the threshold. Using signaling voltages having levels convenient for the internal operation of the Logic Analyzer, the comparator will output a logic ONE or TRUE if the input voltage meets or exceeds the threshold voltage, and will output a logic ZERO or FALSE if the input is less than the threshold. (Of course, the 'meets' or 'equals' aspect of the threshold can be attached to either one—but not to both—of the 'greater than' and 'less than' conditions.) A hysteresis arrangement uses a small offset to produce slightly different 'effective thresholds' for different directions of input signal transition. This prevents indecision (instability) in the output should the input dwell on exactly the threshold, or exhibit noise centered about the threshold. Threshold detection by such comparators can be characterized as converting from whatever signal levels are used in the System Under Test (SUT) to the particular ones used internally by the Logic Analyzer. It is clear that correct operation of a Logic Analyzer depends upon proper threshold comparison. Attending to the selection of proper threshold voltages for the various input signals is one of the main things that the operator of a Logic Analyzer must do.

Logic Analyzers typically have controls that allow the selection of pre-set, or the manual adjustment of, channel thresholds. Sometimes channels are individually adjustable, while other times economic reasons cause related channels to share a common threshold voltage. For example, it is common for there to be 'Probe Pods' attached to the Logic Analyzer through umbilical cables having eight (or sixteen) data channels that share a common adjustable threshold. The designer's assumption is that all eight (or sixteen) SUT channels connected to a particular Probe Pod are likely to share a common logic family, and that a single threshold for all those signals is adequate. There might be a ninth (or seventeenth) channel having a separately adjustable threshold and that is intended for use with a clock signal associated with the data channels of that Probe Pod.

If a threshold is set correctly, it is near the middle of the signal swing for the signal it is to characterize. The usual way to pick the threshold is to consider two identical channels simultaneously undergoing transitions in opposite directions. At some point in time the two channels will exhibit the same voltage. It is this 'crossover' point which is the desired threshold voltage. This technique accounts for the fact that the transitions have finite rise and fall times (if the rise and fall times were actually zero, we would just pick as the threshold the midpoint between signal extremes, and be done with it . . . ), and is generally thought to give the most faithful translation of signal timing from the (external) SUT levels to the (internal) levels used within the Logic Analyzer.

As the threshold is set farther from the optimum (crossover) value described above, the timing of the translated signal becomes more and more distorted. Eventually, for a threshold set above or below the limits of the external (input) levels, the translated (internal) signal becomes a constant value of respective FALSE or TRUE, and all timing information (and information content!) from the external input signal is lost.

Thus, if the threshold for any input signal to the Logic Analyzer is set inappropriately (significantly away from the crossover value, or even near or outside the voltage limits of the signal swing), little or no useful information about the signal can be acquired. If that signal is used as a clock (or as a clock qualification component) in a synchronous acquisition (i.e., as part of a logic state measurement), then little or no information about ANY signal will be acquired. The extreme condition where the signal swing for a clock seldom or never crosses the threshold is variously known as an "idle clock input" or as a "slow or missing clock input". The trace will be missing entire sections corresponding to where there 'was no clock', and sections that are present may be corrupt. If the signal with an inappropriate threshold is a data (non-clock) signal, then captured state data may be corrupted, with whatever attendant implications for the understanding of the trace. It is abundantly clear that successful operation of a Logic Analyzer depends upon proper settings for the thresholds.

Some prior art Logic Analyzer systems have implemented schemes for alerting the user that an input channel appears to be inactive. For example, U.S. Pat. No. 4,293,925 describes just such a system. For each channel that does not eventually exhibit a different logical value when sampled periodically, it displays an 'idle channel' indicator. More refined versions of this further indicate for each channel if the associated threshold is above, below or within the signal activity range for that channel. Such displays of information consume space on the display, and may be perceived as clutter when not needed. Such indications can either be (wrongly) ignored or turned off to simplify the presentation. Furthermore, other subsequent errors or abnormalities may be announced which are caused by an inappropriate threshold, but whose accompanying indicia or legends are more general and not specific to simply thresholds. So, for example, a Logic Analyzer whose clock threshold is too high will stall the entire measurement. The accompanying error message might be "WAITING FOR TRIGGER" or perhaps, if the analyzer appreciates which channels are being used as clocks, "IDLE CLOCK INPUT". . . . In any case, the notion that the threshold might be too high is lost as being just one among other possibilities, such as a flying lead that has become disconnected from its correct terminal, or that has been accidently connected to, say, ground. The point is that there might be no explicit mention of the term 'THRESHOLD' in the warning or error message. Indeed, a data channel with an out-of-bounds threshold might generate NO warning at all, as this is not a fatal condition that would keep the analyzer from running. It is just that the trace would be wrong. The operator could spend a lot of time looking for a problem in his SUT that is really just an inappropriate threshold setting for a channel of the Logic Analyzer.

In summary, the various prior art signal activity schemes all require that the user take the time to inspect these indicators, that he or she has a background that allows an informative interpretation of what is indicated, and that they be a good sleuth, to boot.

A knowledgeable and experienced operator can use the prior art controls and indicators to set thresholds to values that make sense for the SUT, as well as appreciate the differences between a likely SUT failure, botched probe connections and inappropriate thresholds. Less seasoned operators can experience trouble and frustration, or worse, not even appreciate that there is a problem. What might happen, for example, if they do not appreciate, or have forgotten about, the common threshold for a Probe Pod?

It would be desirable if a Logic Analyzer automatically presented signal activity and threshold information in a more informative format, and which took into account various configuration information used or solicited during measurement setup activities.

SUMMARY OF THE INVENTION

A solution to the problem of enabling a Logic Analyzer to provide a more intuitive and informative presentation of signal activity and threshold settings is to gather a collection of factors pertaining to the measurement to be performed, either as informed defaults, inferences made from various parameter selections made by the operator during measurement set-up, or as the result of a direct inquiry. Among these factors is information about which channels are members of which labeled groups. These are 'assigned' channels. Another item of information is the channel threshold, which might be pre-assigned either by logic family type or assigned manually. Either in response to an operator request, or subsequent to a RUN command to begin a measurement, a scan of signal activity is performed for each assigned channel as its threshold is briefly swept. This produces a range of voltage that describes that signal's signal activity. These ranges are then displayed as analog lengths within columns as adjacent vertical segments of a voltage swing Y axis (ordinate) along a channels-within-a-probe-pod X axis (abscissa). The Y axis is labeled with actual voltage values. Superimposed upon this display is a horizontal line indicating the associated threshold for that Probe Pod. Such displays are created for each Probe Pod in use. Further annotating the display are, for each column, channel identifiers and signal activity indicators whose shapes connote recurring transitions and signals that appear to be 'stuck' either HIGH or LOW. Collections of related columns are labeled according to the Probe Pod with which they are associated.

DESCRIPTION OF A PREFERRED EMBODIMENT

Figure 1A:
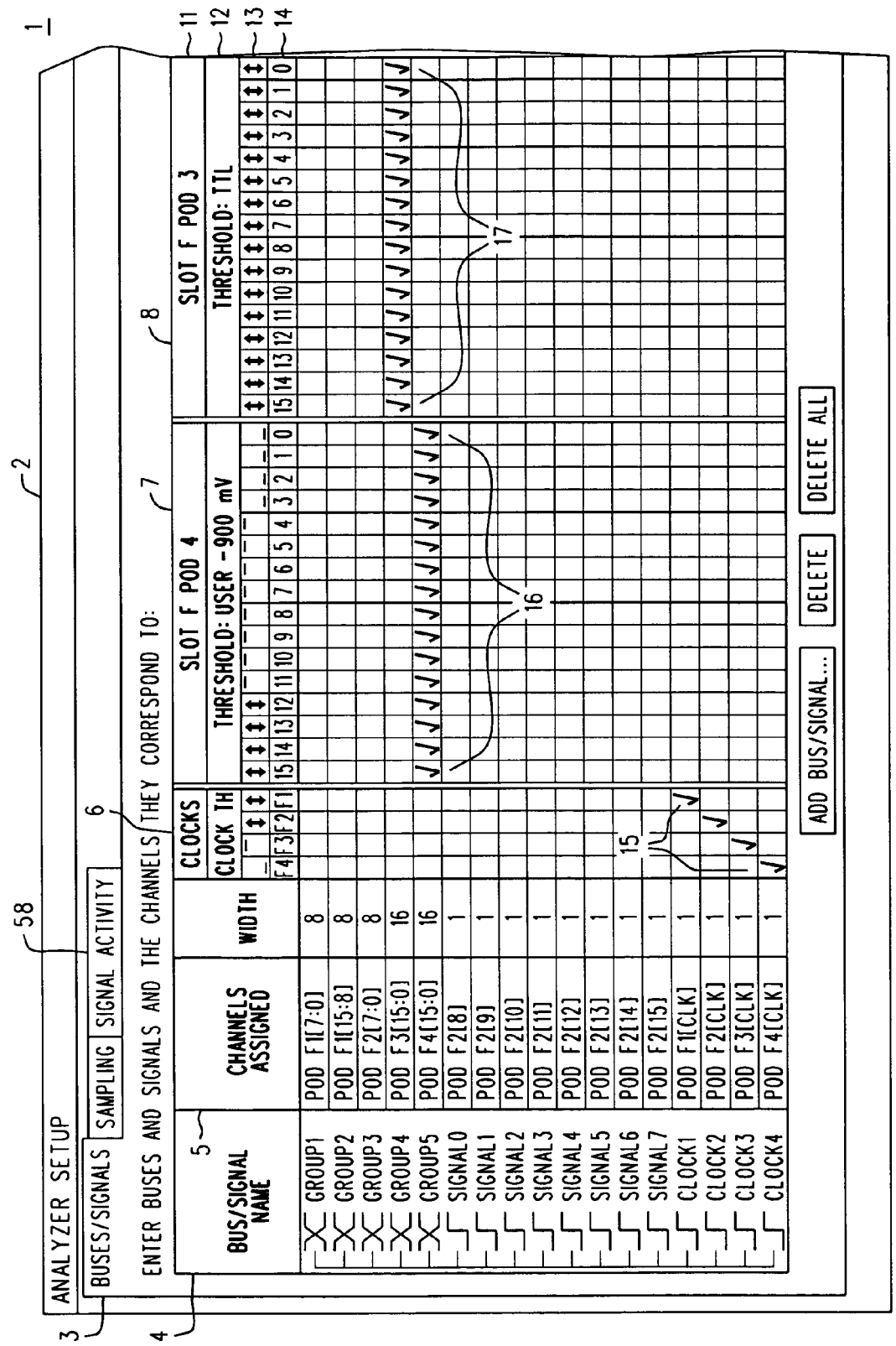
FIGS. 1A-B are a rendition of a screen that is part of a GUI for Logic Analyzer set-up and which, through the BUSES/SIGNALS tab, pertains to grouping input channels for Probe Pods into labeled collections and which also, through the SIGNAL ACTIVITY tab, pertains to the setting and evaluation of thresholds for those channels.
Figure 1B:
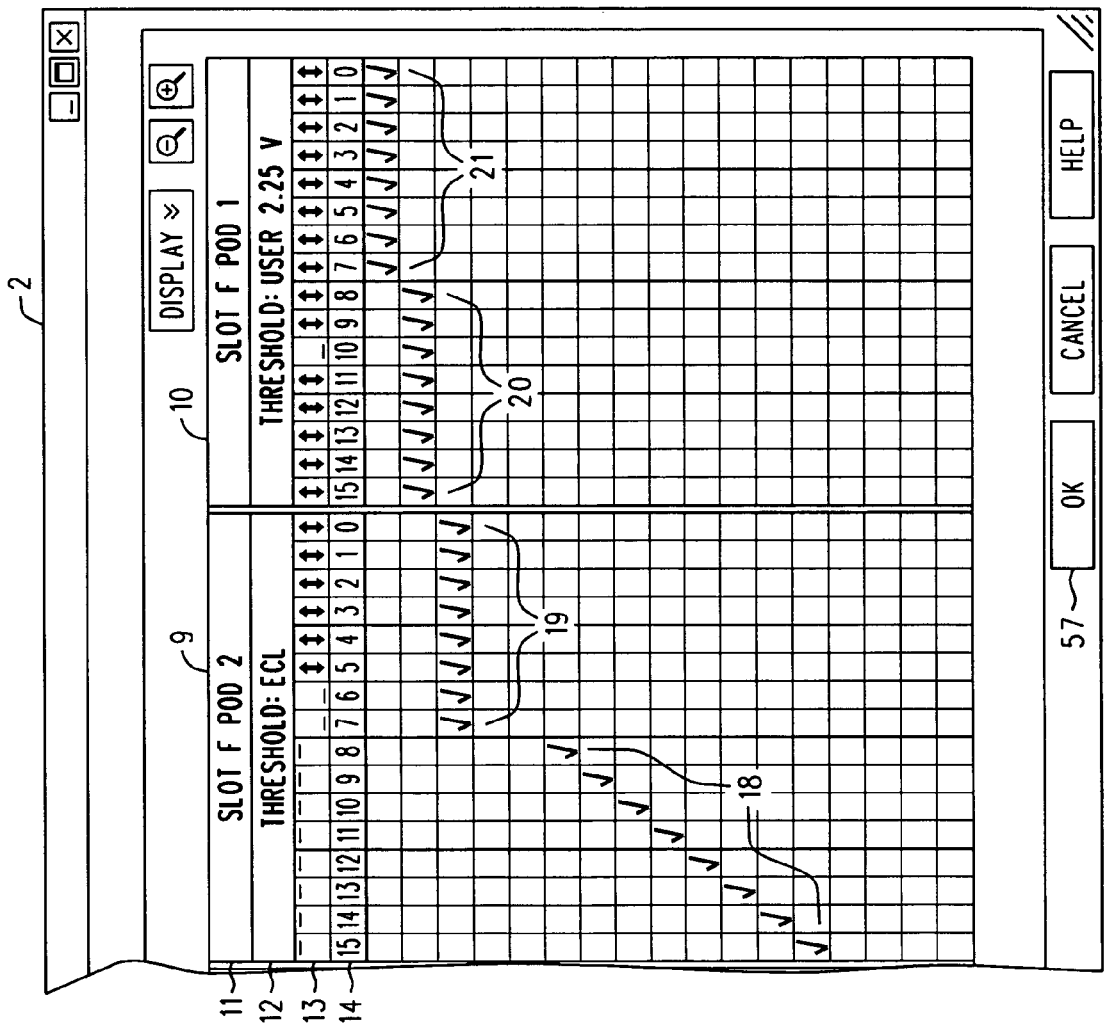

Refer now to FIGS. 1A-B, wherein is shown a rendition 1 of an ANALYZER SETUP screen 2 that is part of a GUI (Graphical User Interface) for a Logic Analyzer set-up process and which, through the BUSES/SIGNALS tab 3, pertains to grouping input channels for Probe Pods into labeled collections and which also, through the SIGNAL ACTIVITY tab 58, pertains to the setting and evaluation of thresholds for those channels. With the exception of the SIGNAL ACTIVITY tab 58, much of the material depicted in FIGS. 1A-B is conventional, which will allow us to give just a brief overview of what is shown there. In that connection, we shall concentrate less on the process of specifying the content of FIGS. 1A-B, and more on the meaning of what is shown therein, save to say that the user specified content of the screen 2 is determined by a mouse clicks or other screen pointer operations performed in conjunction with typing names or other values into fields that are presented for that purpose, all while the BUSES/SIGNALS tab 3 is in front (obtained by clicking on that tab). For simplicity, we have omitted herein any depiction of the screen pointer or cursor (which commonly is a small arrow).

Here in summary, then, is what FIGS. 1A-B tell us. To begin, note column 4 called BUS/SIGNAL NAME. It indicates that five collections called GROUP1 through GROUP5 have been defined, and that they are buses. We can tell that because of the 'sideways x' to the left of the labels, and also because in column 5 each of those labels is associated with a range of signals (e.g., GROUP1 is the eight channels 0-7 of POD 1 in SLOT F, or channels 0-7 of 'POD F1', which conveniently shortens to POD F1[7:0]). The remaining labels in the column 5 called CHANNELS ASSIGNED are all for single signals. In this example those additional labels are for additional signals, and it will be appreciated that contrary to such a case, it is possible that a given signal might have different (multiple) names, the better to intuitively refer to that signal within different contexts. Four of the signals (CLOCK1-CLOCK4) are labeled as clocks, and in the CHANNELS ASSIGNED column 5 they appear (respectively) as POD F1[CLK] through POD F4[CLK], where that notation is synonymous with POD F1[16] through POD F4[16] (assuming the seventeenth input of a sixteen-data-input Pod is the clock input, and channel enumeration starts with zero).

In the CLOCKS column (6) we see checkmarks 15 that associate the labels CLOCK1-CLOCK4 with the Pods' clock inputs. In a similar vein, in column 7 for SLOT F POD 4 we see a row of checkmarks 16 that instantiate the meaning of GROUP5 as POD F4[15:0]. Column 8 for SLOT F POD 3 does a similar thing for GROUP4 with the row of checkmarks 17. Moving to FIG. 1B, we see that the labels SIGNAL 0 through SIGNAL7 and GROUP3 are associated with their channels in column 9 for SLOT F POD 2 by the (not on a row) collection of checkmarks 18 and by the row of checkmarks 19, respectively. Collection 18 is not a row, as it reflects that each of SIGNAL0 through SIGNAL7 is a label for just a single signal. Collection 19 is a row, since it instantiates GROUP3, which is indeed POD F2[7:0]. Rows 20 and 21 in column 10 for SLOT F POD1 are associated in a similar manner with GROUP2 and GROUP1, respectively.

Now note row 11, which contains 'high level' signal location information, such as the associated Slot and Pod. Beneath row 11 is row 12, which is used to convey threshold type information for the various columns (6-10). From an inspection of the Figure it can be seen that SLOT F POD4 has a USER (i.e., a user selected) threshold of −900 mV, SLOT F POD3 has a system defined (and industry standard) TTL level, SLOT F POD2 has a system defined ECL level, while SLOT F POD1 is again a USER level, but with 2.25 Volts.

Row 14 is used to display the numerical signal identifier (channel) within the Pod, while row 13 displays, for each input channel of a Pod (whether for data or a clock), a symbol that indicates the type of excursion that the signal on each channel appears to be making. There are three such symbols: a double ended vertical arrow indicates a signal that appears to transition through the associated threshold at least every so often, an upwardly displaced horizontal bar indicates a signal 'stuck' HIGH, and a downwardly displaced horizontal bar indicates a signal that is 'stuck' LOW. 'Stuck' means only that there was no transition through the threshold, implying that the signal remains above or below the threshold. Note that in this context HIGH and LOW do not necessarily mean that the signal is quiescent nor that it is at a voltage extreme. Before leaving the subject matter of FIGS. 1A-B, it will be appreciated that, other than an operator's noticing abrupt (and extreme) changes in these three symbols of row 13 as a large range of different thresholds might be specified, there is no finely graded indication of any relationship between actual signal swing and a given threshold.

And, as to how the threshold for a given Pod is actually set, that is performed by clicking on the legend THRESHOLD for that Pod (or, within that portion of row 12 which is for that Pod). Such an action (say, for SLOT F POD 3) brings up the (prior art) dialog box 22 shown in FIG. 2. It is here that the operator can 'push' (click on) a radio button STANDARD that has an associated drop-down menu 25 that includes the various predefined industry standard threshold values. Note that the selected menu entry is TTL, which comports with what is shown at column 8 FIG. 1A. Had the click instead been on or near the legend THRESHOLD for column 9, the legend (already showing) in menu 25 would be ECL.

Of course, the operator might want to specify a USER (user defined) threshold. In that case the radio button for USER DEFINED would be 'pushed' instead. He or she would then simply key a threshold value into the left side of box 26, or use the buttons within box 26 to alter an initial default or other previously existing threshold value.

Some other settings may be made with dialog box 22. For the sake of completeness, here is a brief description of those other items. Note drop-down menu 24. It currently specifies GENERAL PURPOSE PROBING. This covers the flying lead case, as well as being suitable for custom connection to the signals via a connector other than one associated with a published industry standard. Another choice for menu 24 is HIGH SENSITIVITY, which is similar, save that internal resistive dividers having less attenuation (and also less isolation) are used by the Logic Analyzer. Finally, there are a number of other published industry standards that specify signal names, connector type and a signal name/connector pin correspondence. These arrangements are identified by the name of the connector type, and those names are also members of the list that appears as part of the drop-down menu 24. A further consequence of selecting one of those industry standards is that much of the configuration activity described in connection with FIGS. 1A-B is invoked automatically.

Figure 2:
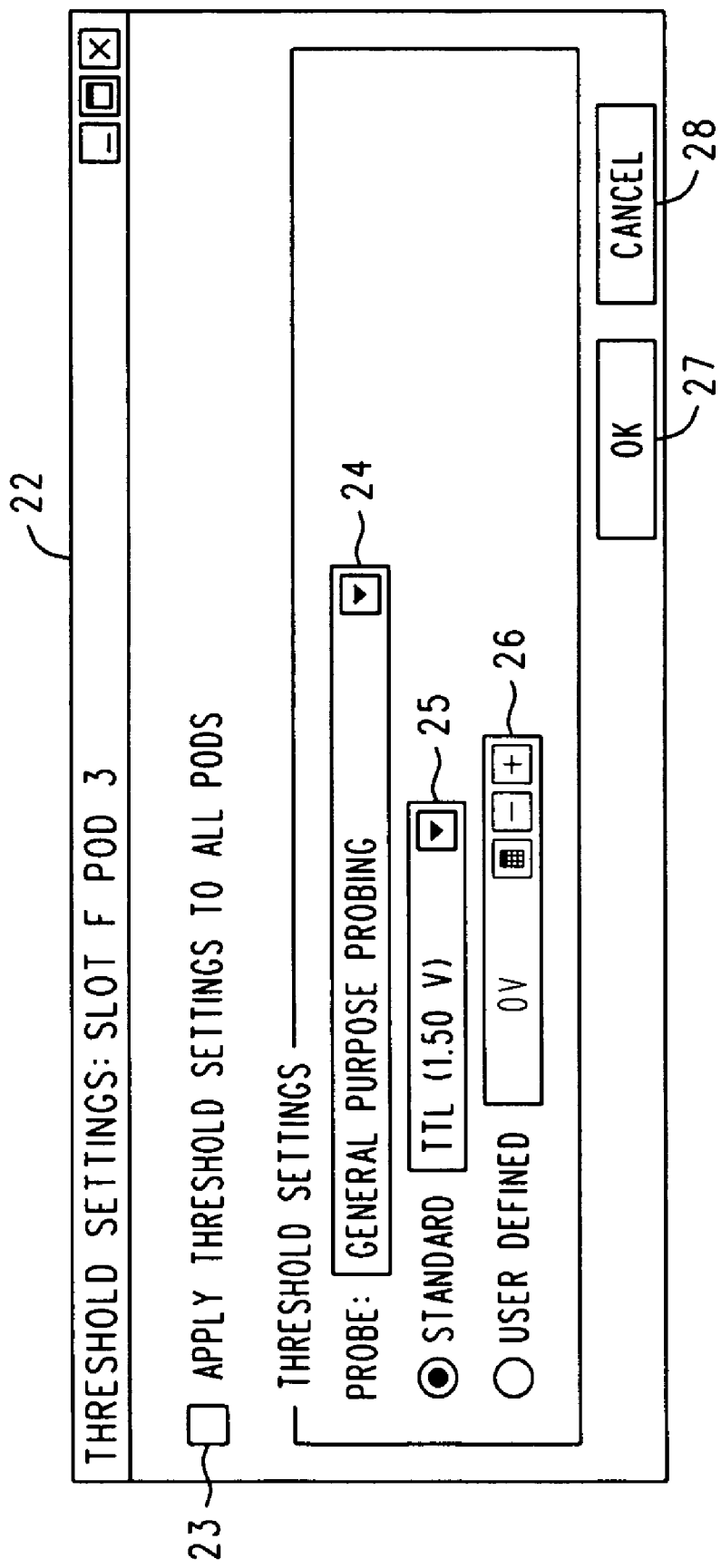
FIG. 2 is a rendition of a prior art dialog for setting the threshold for a Probe Pod selected by clicking on related THRESHOLD legend in FIGS. 1A-B.

The dialog box 22 of FIG. 2 also includes a check box 23 whose associated legend is APPLY THRESHOLD SETTINGS TO ALL PODS. Checking this box will make ALL (clocks and data) thresholds be the same. Clearly, there is some user awareness required here to avoid shooting oneself in the foot, as this will not make sense unless all thresholds are of the same type (e.g., TTL or ECL, etc.) Other versions of this mechanism (23) for different products can have two check boxes, one for all data signals and one for all clocks. In any event, there are times when this notion of a common threshold is a definite convenience, particularly when the decision is made to modify the threshold value, as will be described in due course in connection with FIGS. 3A-B.

In final connection with FIG. 2, note the OK button 27 and the CANCEL button 28. These perform their customary usual function for such a dialog box.

Figure 3A:
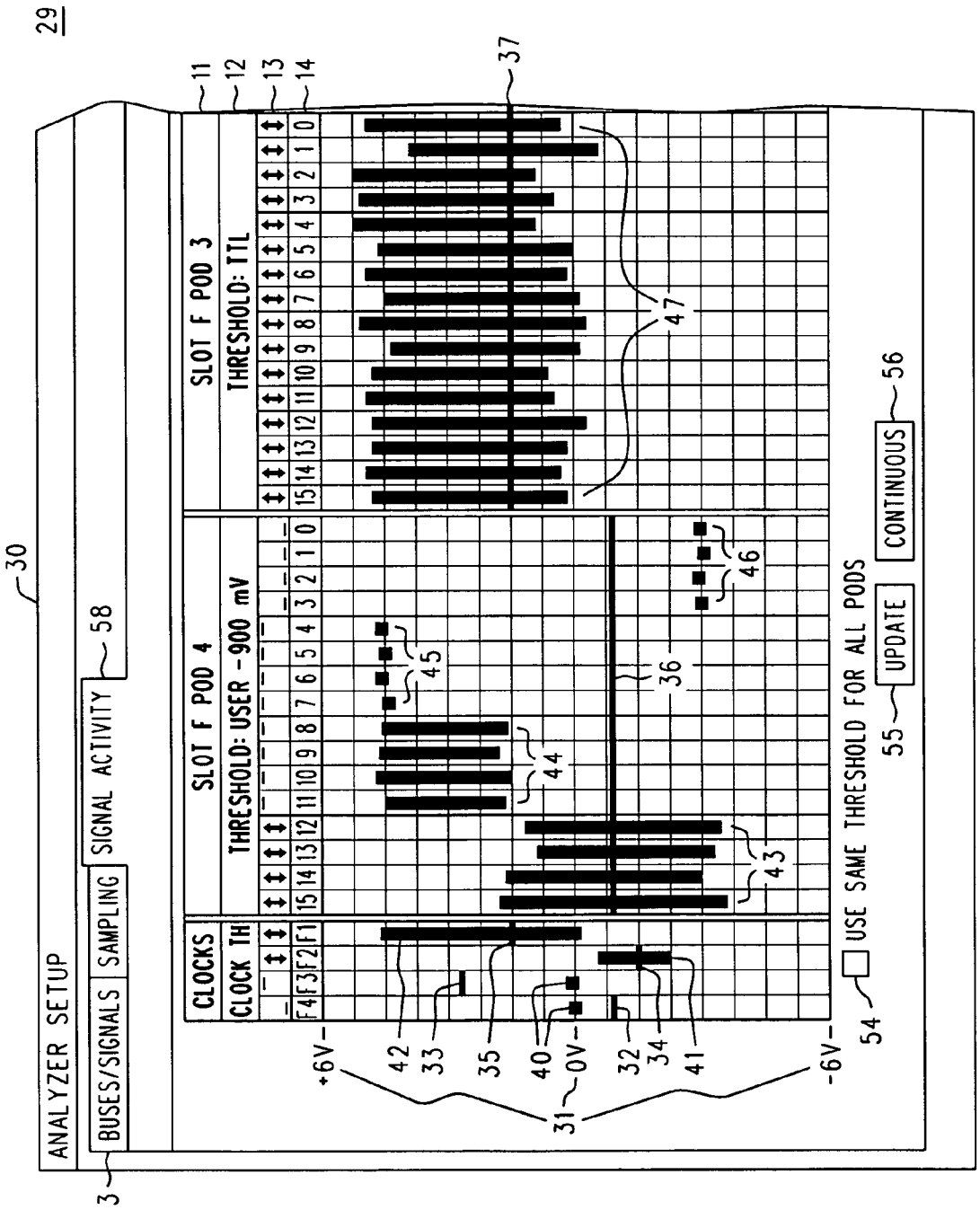
FIGS. 3A-B are a rendition of a screen presented by clicking on the SIGNAL ACTIVITY tab of FIGS. 1A-B, and which graphically displays analog representations of channel signal swing superimposed upon corresponding thresholds.
Figure 3B:
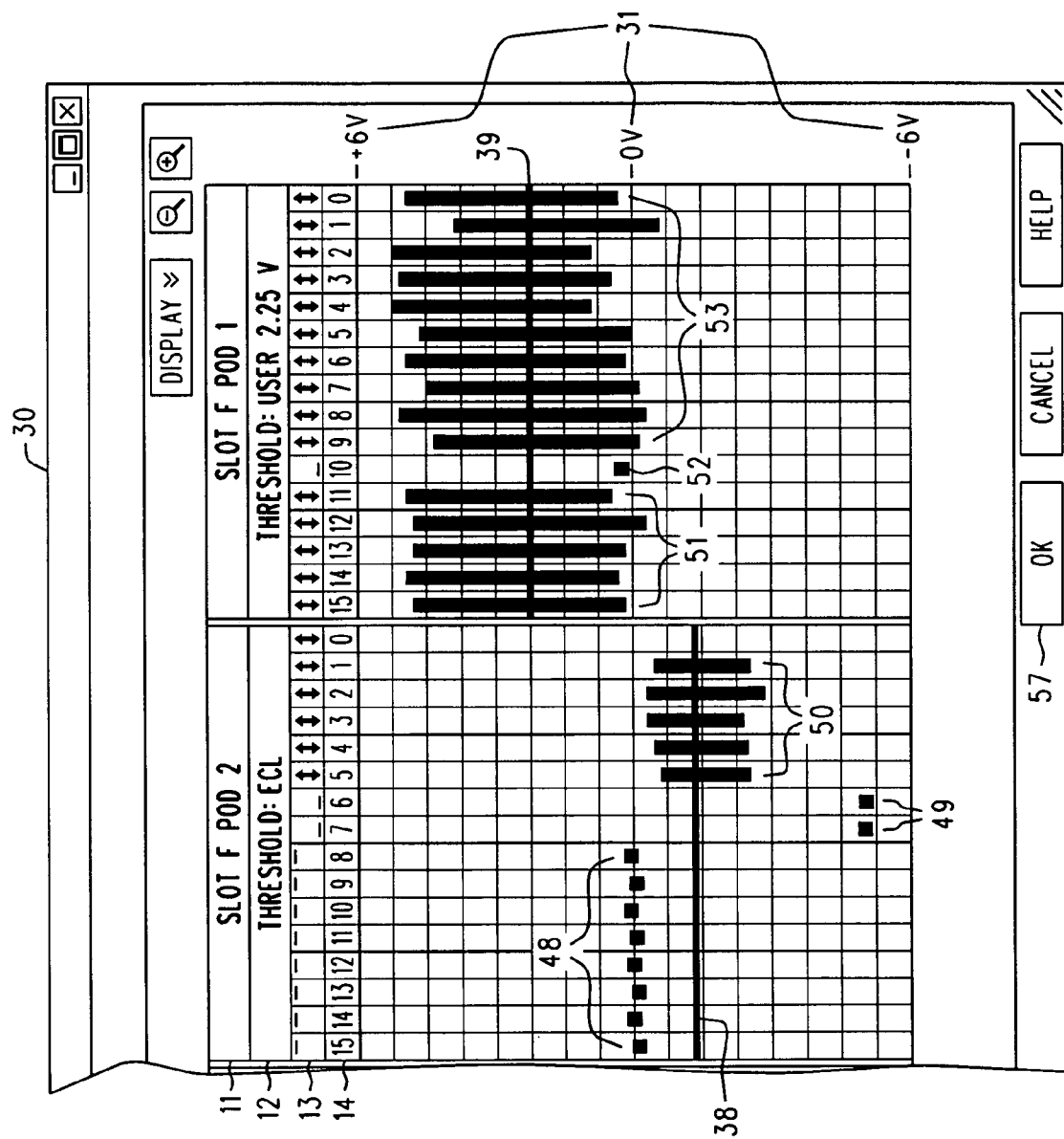

Turning now to FIGS. 3A-B, the screen 29 depicted therein is reached by clicking on tab 58 within the ANALYZER SETUP screen 30. Some content of the screen 29 is the same as in the screen 1 of FIGS. 1A-B; e.g., the various tabs (3 and 58), rows 11-14, and the organization of adjacent columns representing channels associated with Probe Pods. What is different is the nature of the information that is placed within the adjacent columns.

To begin with, the (vertical) direction along the columns represents voltage, and is so labeled (31). Heavy (vertical) bars (40 through 53) within the columns indicate the extent of the detected signal swing for the signal associated with the column. In a system with a color display these bars (40-53) may be of a color related to the nature (purpose or use) of the signals, or perhaps to their defined group. Horizontal bars (32 through 39) indicate threshold voltages for the various channels. It is clear that screen 29 shows the relationship, for each channel, of the threshold and the channel's signal swing. Accordingly, it can be observed that all of the signals for SLOT F POD 3 have swings (47) that cross the associated threshold (37). Note that all of the signal activity indicators for SLOT F POD 3 in row 13 are of the double ended arrow type. However, by looking at the location of threshold line 37 within the pattern of signal swings (47), one can assess if the threshold is marginal, etc. So, one might note that channels two and four of SLOT F POD 3 represent a condition of nearby threshold voltage limit in the negative direction, and that channel one would limit the threshold in the positive direction. None of this type of information is conveyed by the double ended arrows of row 13.

Continuing in this vein, we note also that some signal swings do not cross their associated thresholds (40/32, 40/33, 44/36, 45/36, 46/36, 48/38, 49/38 and 52/39). We also note that in those instances there is also the appropriate activity symbol in row 13, but that the columnar displays described provide a more informative view: is the signal activity condition a result of marginal signal swing or inappropriate threshold, or is it more likely because an input signal is either floating or grounded? In that connection, 48 and 49 are perhaps not suspicious, while 52 is. Not only that, but actual troubleshooting information is available, without having to go in search of an oscilloscope and hook that puppy up. So, in the case of 52 (a bar of minimal extent) it might be the case that a flying lead has come loose or has an internal open circuit, but if 52 were several times longer yet did not reach the threshold, we might suspect that there was severe signal loading or a defective line driver.

Here are some additional things to note concerning FIGS. 3A-B. Check box 54 is equivalent to check box 23 of FIG. 2, and is replicated on screen 29 for the operator's convenience. Buttons 55 (UPDATE) and 56 (CONTINUOUS) deserve some explanation, in connection with which it behooves us to explain how the vertical bars for signal swing are obtained.

When screen 29 is first entered, subsequent to a 'pushing' of (clicking on) the UPDATE button 55, or pushing the CONTINUOUS button to latch it 'in' (pushing it again unlatches it, as does pushing UPDATE) the Logic Analyzer systematically varies the thresholds for all the channels that will be included in the display (and preferably just those channels, the better to save time) and notes the range for which each such signal (channel) exhibits activity by crossing these trial thresholds. The noted range is converted into the displayed signal activity bars (40-53) This takes some time, perhaps a second or two for a system with many (displayed) channels. During this time the Logic Analyzer will be less responsive to other operations the user might request. It is for this reason that the signal swing discovery operation is performed only once upon initial entry to screen 29, and when UPDATE is pressed. However, there are other times when the operator might wish to adjust something to see its effect on signal swing. In those cases it is desirable that the act of varying the thresholds as deliberate trials to discover the extent of signal swing be repeated and the results displayed continuously. For that reason the screen 29 of FIGS. 3A-B includes a CONTINUOUS button 56, that when latched in does just that.

While the screen 29 of FIGS. 3A-B is visible, the operator can position the screen pointer (not shown) over any of the threshold indications (32-39) and 'grab' it by pressing and holding a button on the mouse, after which moving the pointer 'drags' the threshold to a new value. The threshold is left set to such a new value by 'dropping' it (releasing the mouse button). During such a drag and drop operation to change a threshold any surrounding rules for common threshold values are observed. That is, for common data signal thresholds within a Pod, changing one changes the others, and the notion of using the same thresholds for all Pods by checking box 54 of FIG. 3A or box 23 of FIG. 2 is also enforced.

We have assumed in FIGS. 3A-B, as is customary for such test equipment, that the voltage axis is vertical and that the horizontal axis represents different channels. While the results might appear somewhat odd at first, it will be appreciated that these uses of the horizontal and vertical directions could be interchanged. On the other hand, we have a desire to keep the format of screen 29 of FIGS. 3A-B similar to that of screen 1 of FIGS. 1A-B, and in screen 1 there is a definite urge to show the bus and signal names in column 4 as horizontal legends readable from left to right, stacked vertically. Once that format is chosen, it follows that a 'compatible' FIG. 3A-B will use the horizontal axis for channels, thus forcing the vertical axis to be voltage.

Note the OK button 57, which is also shown as part of FIGS. 1A-B. It ratifies any changes made using any aspect of the ANALYZER SETUP screen.

Figure 4:
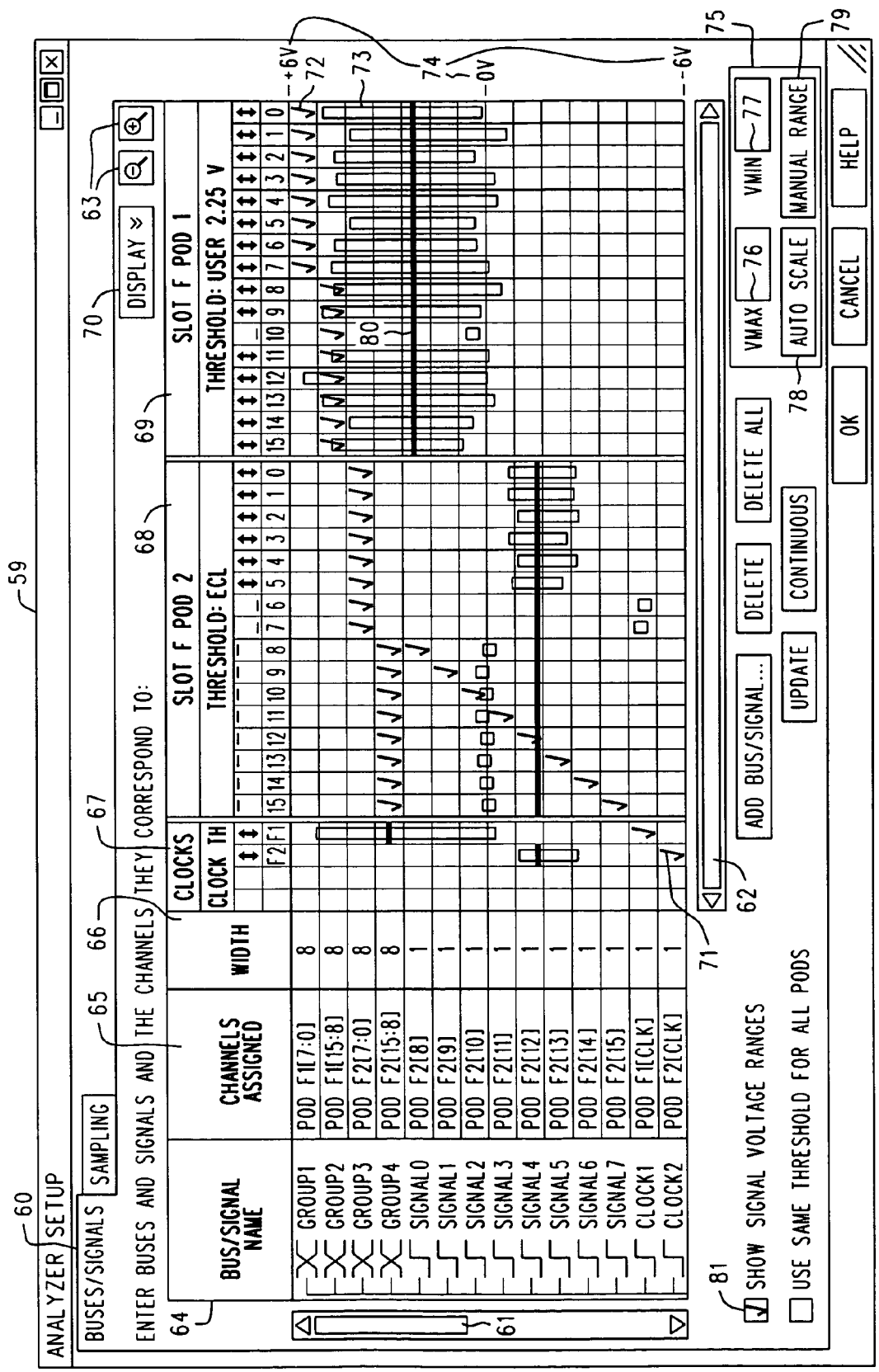
FIG. 4 is a rendition of a screen that combines aspects of FIGS. 1A-B and FIGS. 3A-B.

Referring now to FIG. 4, shown there is an example Logic Analyzer measurement configuration that is similar to that of FIGS. 3A-B, except that: (1) The collection of input signals and labels is somewhat different; and (2) Now the information of the BUS/SIGNALS tab 3 and SIGNAL ACTIVITY tab 58 of FIGS. 3A-B are combined as part of one BUS/SIGNALS tab 60 in FIG. 4. Note that there is no SIGNAL ACTIVITY tab. Much of the rest of FIG. 4 is of a nature that is understood to be the same as in earlier figures (e.g., columns 64, 65 and 66), and thus will be not re-described. There are, however, some differences that we now point out and which concern the manner in which information is displayed.

First, note sliders 61 and 62. Slider 61 vertically scrolls the content of screen 59, with the implication that there are more items in the BUS/SIGNAL NAME column 64 than can be displayed. Next, a similar implication can arise for the SLOT/POD columns (68, 69) from slider 62. In addition, the displayed information contains both the various checkmarks (71, 72) explained (15-21) in connection with FIG. 1, as well as various signal excursion (or signal range) indications 73. In this case, however, it is possible that the checkmarks and the signal excursion indications will overlap. Accordingly, the signal excursion indications are of a 'transparent' nature, so as to accommodate that possibility and thus prevent one indication from obscuring the presence of the other. The threshold setting indicators (e.g., 80) remain as before.

The DISPLAY button 70 (which is also shown as part of FIGS. 3A-B) produces a drop down menu (not shown) that allows the user to select just which combination of columns are to be in the displayed screen. So, the BUS/SIGNAL NAME column 64 will always be present, but it is easy to appreciate that there are times when columns 65 and 66 can be suppressed or dispensed with. Likewise, there are other types of columns, such a polarity column (prior art that is not shown or discussed) that might be made visible. Thus, the drop down menu for the DISPLAY button 70 uses check boxes to allow the user to select which columns to include in the display of the screen 59 (and also of 30 in FIGS. 3A-B). In a similar vein, PLUS and MINUS (magnifying glass) buttons 63 allow the user to increase or decrease the number of SLOT/POD columns 68 and 69 (or 7-10 in FIGS. 1A-B) that are included in the screen. This change is accompanied by a corresponding change in the screen space devoted to the width of a cell formed by the intersection of a BUS or SIGNAL NAME and a numbered channel for the Pods.

Now consider slider 61. It is shown as being about half its possible size, and at the top of its range. The implication is that about half of the list of BUS/SIGNAL NAMES is shown, with another half of the list residing below the GROUP1 to CLOCK2 sequence shown. If slider 61 were grabbed with the screen pointer and dragged downward, the list of BUS/SIGNAL NAMES would scroll upward accordingly, as would the information displayed as part of POD columns 68 and 69: what would be shown there is whatever assignments of channels for POD 1 and POD 2 that are associated with labels for visible BUS/SIGNAL NAMES. (Remember that channels can have multiple names—note that channels eight through fifteen of SLOT F POD 2 each have two checkmarks in their columns. There could even be more checkmarks for BUS/SIGNAL NAMES not visible in column 64.)

Now consider slider 62. It is shown as being at its maximum size. The implication here is that screen 59 is large enough to display information for all the Pods that are in use. Pod numbering starts at POD 1 and not POD 0, and evidently there are no other Pods to the left of those that are shown. If there are many Pods, then the number of Pods that will be shown by an appropriately smaller slider 62 is also influenced by uses of the PLUS and MINUS magnifying glass buttons 63.

The operation of sliders 61 and 62 is independent in the following sense: moving one does not automatically move the other. Instead, it is as if there were elsewhere (in memory, actually) a suitably large structure of columns for $Slot_i Pod_j$ indexed vertically by all the BUS/SIGNAL NAMES, so that what is shown in the screen 59 (as columns 68 and 69) is the intersection within that structure of the 'span' of the two sliders 61 and 62. It is quite possible to position the two sliders to reveal a section of the structure that reveals either labels whose signals are not visible, or signals whose labels are not visible. On the other hand, this is perfectly viable arrangement, since there is nothing to prevent the definition of a label from including signals that come from Pods that are on the 'far left' and on the 'far right'. All that means is that it might not be possible to see the all the signals of some BUS or SIGNAL NAME at once, and that some further scrolling with slider 62 is necessary. An automated scrolling mechanism that attempted to keep associated activity on screen as one or the other slider was moved would be tripped up by this possibility, and would likely either annoy or confuse the operator.

Note also that a SHOW SIGNAL VOLTAGE RANGES box 81 is checked. It is the checking of this box that makes the signal excursions (73) visible as part of the screen 59, and allows the absence of a SIGNAL ACTIVITY tab. However, as has been explained, the presence of slider 62, and also the actions of PLUS and MINUS buttons 63, have an impact on what Pods are included in the visible portion of screen 59. Each Pod has an associated collection of signal voltage swings, and these need not be the same; they might overlap in greater or less degree, or be entirely disparate. This will have an effect on the voltage scale 74 assigned to the voltage axis. In connection with this topic, we now introduce box 75 and its four controls (76,77,78,79).

The purpose for box 75 and its controls is to allow the user the ability to select how the voltage axis 74 is specified. For example, the view shown in FIG. 4 is consistent with the AUTO SCALE button 78 having been 'pressed' (clicked upon so it is 'pushed in'). What AUTO SCALE does is use a voltage range that encompasses all needed voltage values for the signal excursions (and including thresholds) for all Pods that are to be part of the display. It can be appreciated that if the display were restricted to just POD2 (i.e., column 68) that there would be no need for any positive portion of voltage axis 74; a range of 0V to −6V would be entirely adequate for the example shown. The user could force that (or some other range) by pressing the MANUAL RANGE button 79 (thus turning off AUTO SCALE, so its button 'sticks out' and button 79 is 'in') and then keying the desired maximum and minimum values into the boxes 76 and 77, respectively. (This is accomplished in the usual manner by first positioning the screen pointer—not shown—in the box of interest and then pressing the appropriate keys on a keyboard.) In such a case some or all of the voltage range and threshold information for one or more Pods might go off screen, but that presumably is not a concern while a more convenient (and probably expanded, with more resolution) view of a selected channel or group of channels is studied. In any case, it is not difficult to undo the change by again pressing the AUTO SCALE button 78. The voltage ranges within boxes 76 and 77 may remain but be shown as 'grayed out' so as to indicate that they are not in force.

Figure 5:
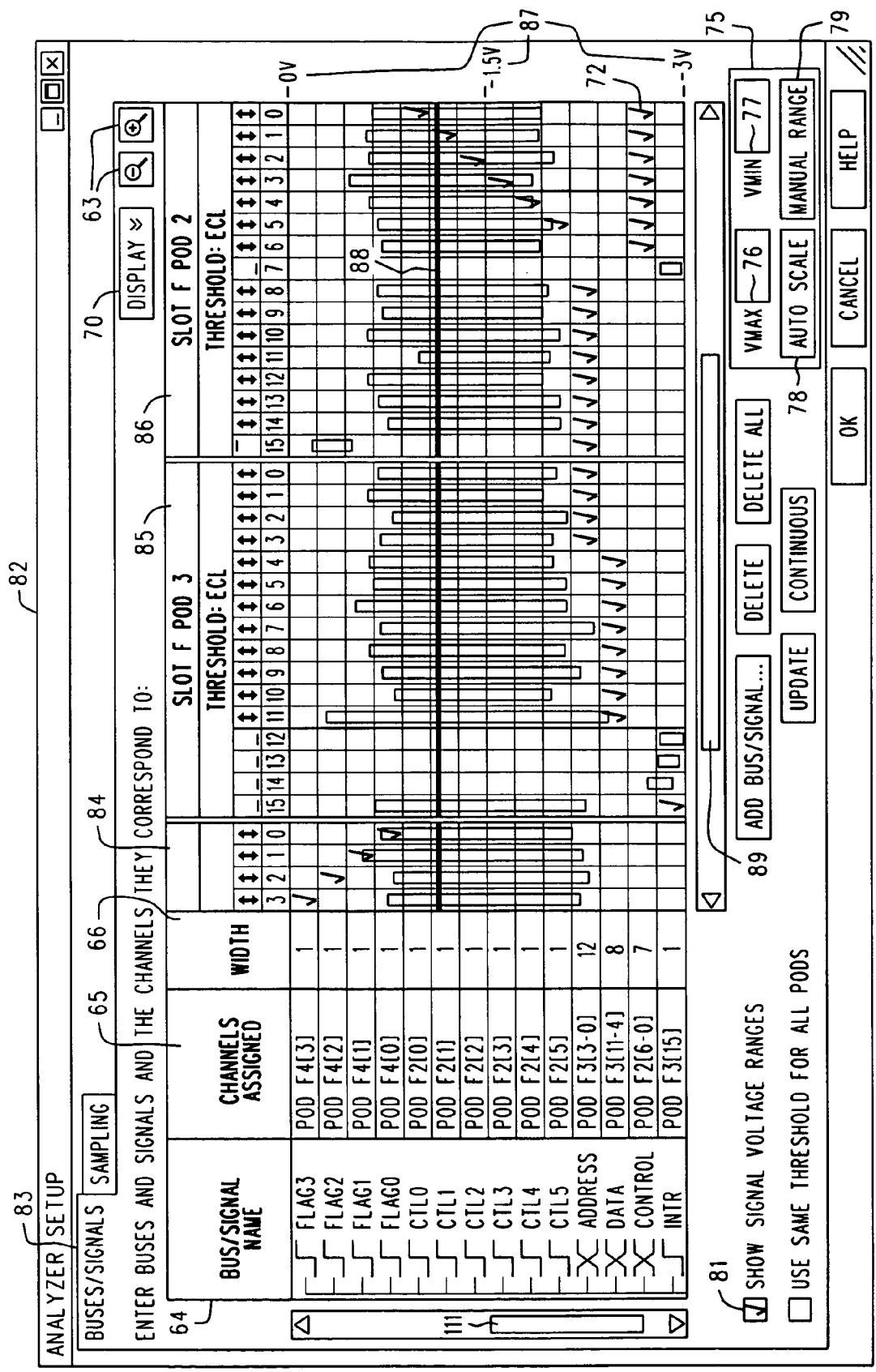
FIG. 5 is a rendition of a screen that is similar to that of FIG. 4, but where there are too many signals to be accommodated within the visible region of that screen and where the use of a different voltage axis arises.

Refer now to FIG. 5, wherein is shown a screen 82 similar to that of FIG. 4. The difference is that the setup in FIG. 4 has more signals applied to the Logic Analyzer, and the controls on the screen 82 are adjusted differently so as to reveal information about those different signals.

In particular, note that the CHANNELS ASSIGNED column 65 indicates that there is a POD F4 of which Channels Zero through Three are assigned to labels FLAG0 through FLAG3, respectively. We see that the bulk of the screen 82 consists of columns 84, 85 and 86, for SLOT F POD 4, SLOT F POD 3 and SLOT F POD 2, respectively. The legend for SLOT F POD 4 is off-screen to the left, as is the CLOCKS column 67 (not visible in FIG. 5, but for comparison, see FIG. 4). In keeping with this, note horizontal slider 89. It affects which Pods are reflected in the screen. In keeping with the described situation, the slider 89 is shown as less than its maximum width, and in a location along its axis of possible locations that reflects which Pods have their information displayed. From this we infer that there are columns for at least SLOT F POD4 and the CLOCKS that are to the left of column 85, and some other columns (for, say SLOT F's PODs One and Two, or perhaps some SLOT E stuff) that are to the right of column 86. We really can't tell, as in a similar fashion, slider 111 is both 'short' and nearly at one end of its range. To determine what else the Logic Analyzer is measuring, one would have to perform additional scrolling by moving both sliders 111 and 89. In particular, dragging slider 89 to the left would scroll the column 84 to the right, ultimately revealing all of column 84 and also, eventually, the CLOCKS column.

Here, however, is what else screen 82 in its present form does tell us. The Pods for columns 85 and 86, and probably for 84 as well, have a threshold 88 that is the standard value for the ECL family of logic parts. Note that the voltage axis 87 runs from 0V to −3V. Other tidbits of information that can be discerned from FIG. 5 include: The signals for POD3 and POD2 are inactive; The signal for POD2 is 'broken' (probably floating—not connected), and; The signal for POD3 shows significant overshoot and undershoot, which an intrepid operator will undoubtably want to investigate.

Figure 6A:
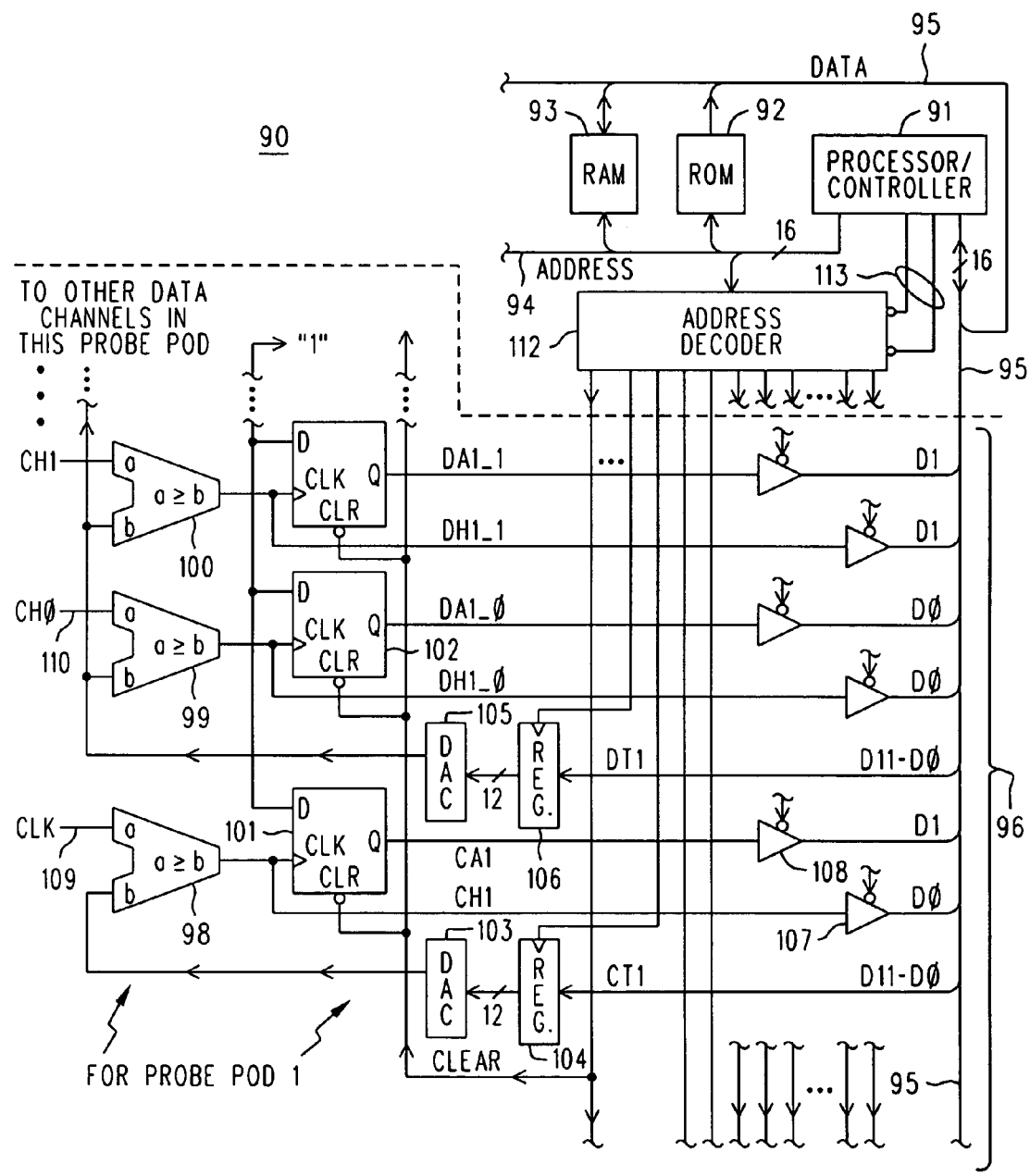
FIGS. 6A-B are a simplified block diagram of a hardware architecture that assists a Logic Analyzer in determining the nature of each signal's activity, or lack thereof, including the range of each signal's excursion.
Figure 6B:
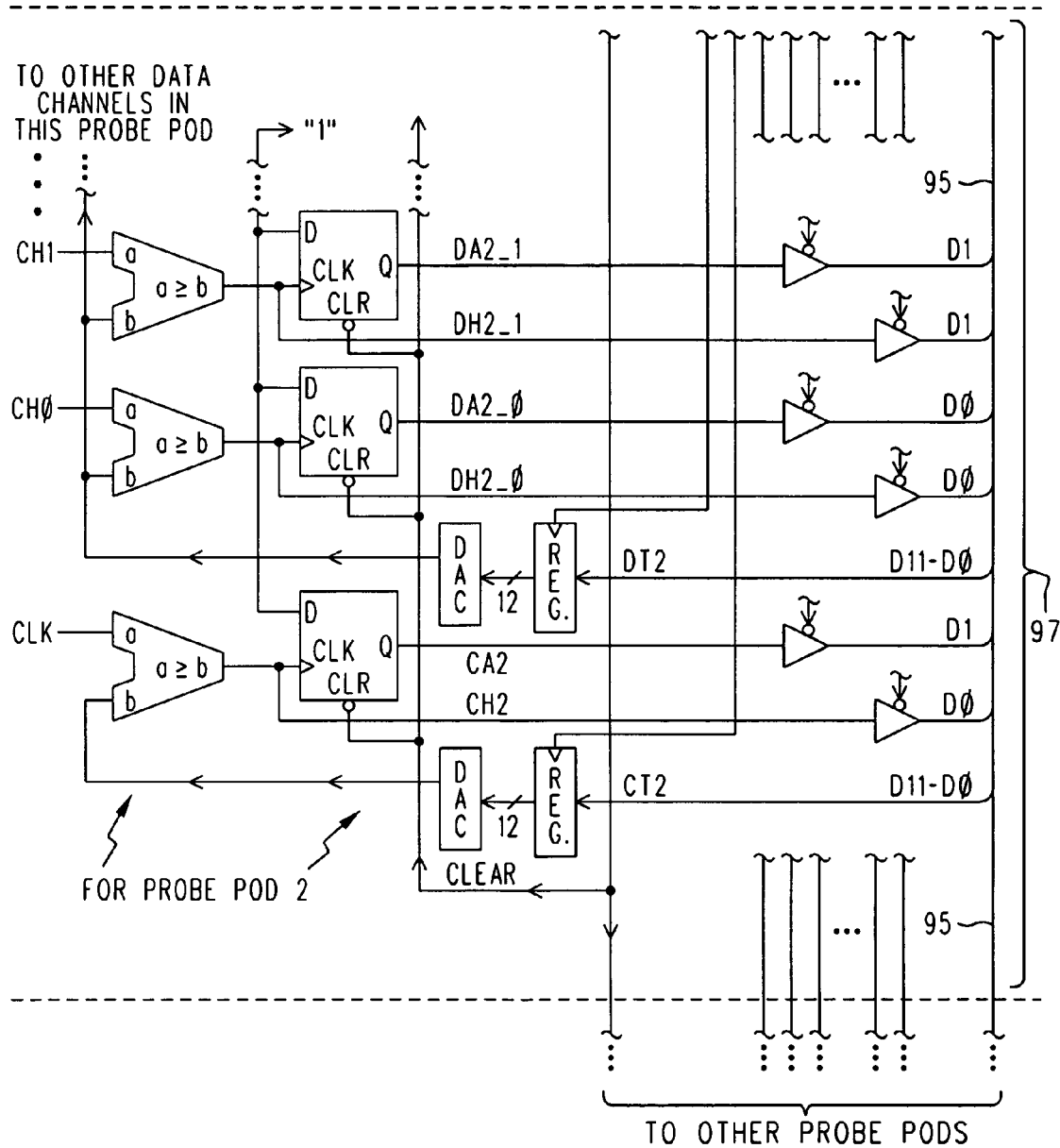

Finally, refer to the block diagram 90 of FIGS. 6A-B. To begin, there is a Processor or Controller 91 that executes object code stored in a ROM (Read Only Memory) 92 and that also stores data in a RAM (Random Access Memory) 93. To this end, those components share an Address Bus 94 and a Data Bus 95. The object code comprises an embedded system that provides the GUI for setting the Logic Analyzer's controls, and that also performs state measurements upon the target system in accordance with control settings established by the operator. At selected locations within the execution of the object code the Processor 91 will exert one or more Control Lines 113 that enable an Address Decoder 112 to produce from an applied address various control signals that orchestrate the operation of Pod related target signal acquisition hardware in such a way (to be described) that the behavior of the signals for a Pod can be inferred from an inspection of the state of that acquisition hardware.

The acquisition hardware that is used for POD 1 is given the reference numeral 96 in FIG. 1A, while that for POD 2 is 97 in FIG. 6B. Each collection of such acquisition hardware receives and is responsive to an appropriate collection of control lines, of which CLEAR is common to all Pods and the channels therein, while most are specific to a Pod; e.g., a signal to enable data to enter a Register that sets a threshold.

The signal naming scheme used for FIGS. 6A-B is:

| | | |
|---|---|---|
| D<N> | e.g. D0 | Data Bus bit N |
| DA<N>_<M> | e.g. DA1_1 | Data Active, Pod N, Bit M |
| DH<N>_<M> | e.g. DH1_0 | Data High, Pod N, Bit M |
| DT<N> | e.g. DT1 | Data Threshold, Pod N |
| CA<N> | e.g. CA1 | Clock Active, Pod N |
| CH<N> | e.g. CH1 | Clock High, Pod N |
| CT<N> | e.g. CT1 | Clock Threshold, Pod N |
| CLEAR | | Clear all the activity flip flops |

For simplicity, the above definitions and FIGS. 6A-B do not contemplate the notion of SLOTS (where sequences of different POD 1-POD 4 might exist for each of SLOT A-SLOT F). We have simplified the naming notation used in the figure to be consistent with just one set of unnamed slots for receiving up to four Probe Pods.

We shall explain what goes on within the acquisition circuitry 96 for POD 1. The operation of the acquisition circuitry 97 for POD 2 is the same, as it also is for any other Pods. The clock signal CLK 109 for POD 1 is applied to an 'a' input of an a≧b Threshold Comparator 98 whose 'b' input is the output of DAC (Digital to Analog Converter) 103. DAC 103 is driven by the content of Register 104, whose content CT1 arrives over the Data Bus 95. The value of the threshold is swept over a range of interest, either linearly or by use of a binary search procedure, and measurements taken at each different threshold value selected to be part of the sweep. The TRUE output of Comparator 98 is used to clock a D Flip-Flop 101 by edge triggering with a rising edge, which prior to a measurement at each new threshold value has been cleared (Q=ZERO) by the signal CLEAR. Thus, when CLK 109 exceeds its new threshold subsequent to being CLEARed, a logic ONE is clocked into D Flip-Flop 101, setting its Q output to a ONE, also. This output is also named CA1, which means that the POD 1 Clock is Active (i.e., it had at least one transition that performed the needed edge triggering of Flip-Flop 101). Signal CH1 (Clock High POD 1) is simply the output of the Threshold Comparator 98. The signals CH1 and CA1 are at appropriate times within each measurement applied to Data Bus 95 through respective Buffers (functioning as switches) 107 and 108, whose power is gated on at times when the values of those signals are of interest. Their values, along with the associated threshold value (i.e., content of Register 104) that produced them are stored in an associated location of a suitable data structure in RAM 93. Once there, those values can be interpreted to infer at what threshold values CLK 109 is LOW, or ZERO, as well as detecting the signal conditions of stuck HIGH, stuck LOW, and ACTIVE. The range of threshold voltages for ACTIVE can also be determined by inspection of POD 1's CLK (109) data in RAM 93. These operations are carried out under the control of the Processor 91 as it executes the embedded system stored in ROM 92. It is in this manner that the embedded system can create the signal activity indicators of row 13 in the various figures, as well as the signal excursion indications for the various channels. The threshold level specified by the operator is, of course, known to the embedded system, and can thus be displayed, also.

Note the Threshold Comparators 99 and 100, for Channel Zero (110) and Channel One, respectively. Their 'a' inputs are similarly compared against the common data channel threshold ('b') determined by Register 106 and DAC 105. The use of a common threshold for the data channels of a Probe Pod is, of course, an expedient to reduce the cost of production, and it will be appreciated that, as has CLK 109, each Data Channel (110, etc.) could have its own Register and DAC for the determination of an independent threshold for each.

In connection with FIGS. 6A-B and the determination of the voltage ranges for signal excursions (41-53, 73) and their various signal activity indicators (14) that are shown in the various figures, the reader is further referred to the APPENDIX. It contains pseudo code that may be used as the basis for executable code that uses the hardware of FIG. 6 to discover the signal excursions and signal activity indicators. It uses a binary search along the voltage axis for each signal. The pseudo code of the APPENDIX is relatively well commented, and is believed to require no further explanation.

I claim:

1. A method of displaying the relationship between a work threshold for a comparator to which a work signal is applied and the signal swing of that work signal, the method comprising the steps of:
   (a) finding the signal swing by the steps of:
   (a1) applying the work signal to the comparator;
   (a2) setting a selected trial threshold for the comparator;
   (a3) setting a bit to a first state;
   (a4) setting the bit to a second state if the comparator indicates a selected comparison;
   (a5) saving the selected trial threshold of step (a2) and the associated outcome of the bit of step (a4);
   (a6) repeating steps (a2) through (a5) for selected trial thresholds; and then
   (a7) examining what was saved by step (a5) to determine the signal swing of the work signal; and then
   (b) displaying a first visual indication within a column associated with the work signal and parallel to a first axis graduated in voltage, the first visual indication being of a length and position that correspond to the signal swing found in step (a).

2. A method as in claim 1 wherein:
   (i) there is a plurality of work signals each having its own corresponding instance of steps (a) and (b);
   (ii) each work signal has an associated and separate column for step (b); and
   (iii) the columns share a common voltage axis for the work threshold and are adjacent.

3. A method as in claim 1 further comprising the step of:
   (c) displaying a second visual indication within the column of step (b) and at a position therein corresponding to the work threshold.

4. A method as in claim 3 wherein:
   (i) there is a plurality of work signals each having its own corresponding instance of steps (a), (b) and (c);
   (ii) each work signal has an associated and separate column for steps (b) and (c); and
   (iii) the columns share a common voltage axis for the work threshold and are adjacent.

5. A method as in claim 1 wherein the selected trial threshold of step (a2) is selected by a linear search.

6. A method as in claim 1 wherein the selected trial threshold of step (a2) is selected by a binary search.

7. A method as in claim 1 wherein the first visual indication of step (b) is transparent.

8. A logic analyzer coupled to a plurality of work signals comprising a collection of input channels and a screen display comprising:
   a columnar display position for each work signal in the plurality thereof and in correspondence with an ordering of the input channels;
   the distance along each columnar display position representing a voltage axis; and
   each columnar display position containing a visual signal swing representation for the signal associated with that each columnar display position, the visual signal swing representation being of a length and position corresponding to a measured signal swing for the signal associated with that each columnar display position.

9. A screen display as in claim 8 further wherein each columnar display position also contains a visual representation of a threshold voltage in use for the associated work signal, the representation of the threshold voltage in use being at a position along the each columnar display position corresponding to the threshold in use for the associated work signal.

\* \* \* \* \*